(12) United States Patent
Novotny et al.

(10) Patent No.: US 6,462,410 B1
(45) Date of Patent: Oct. 8, 2002

(54) INTEGRATED CIRCUIT COMPONENT TEMPERATURE GRADIENT REDUCER

(75) Inventors: Shlomo D. Novotny, Wayland, MA (US); Marlin R. Vogel, Brentwood, CA (US)

(73) Assignee: Sun Microsystems Inc, Santa Clara, CA (US)

( * ) Notice: Subject to any disclaimer, the term of this patent is extended or adjusted under 35 U.S.C. 154(b) by 43 days.

(21) Appl. No.: 09/642,184

(22) Filed: Aug. 17, 2000

(51) Int. Cl.$^7$ .............................................. H01C 23/20
(52) U.S. Cl. ..................... 257/707; 257/706; 257/704; 257/712; 257/713; 257/717; 257/720; 257/723; 361/704; 361/705; 361/716; 361/715
(58) Field of Search ................... 257/707, 706, 257/704, 712, 713, 717, 720, 723; 361/704, 705, 716, 715

(56) References Cited

U.S. PATENT DOCUMENTS

| | | | | |
|---|---|---|---|---|
| 5,276,586 A | * | 1/1994 | Hatsuda et al. | 361/387 |
| 5,296,310 A | | 3/1994 | Kibler et al. | |
| 5,923,084 A | * | 7/1999 | Inoue et al. | 257/712 |
| 6,114,986 A | * | 9/2000 | Cassen et al. | 342/175 |
| 6,281,573 B1 | * | 8/2001 | Atwood et al. | 257/706 |
| 6,281,575 B1 | * | 8/2001 | Nishikawa et al. | 257/707 |

FOREIGN PATENT DOCUMENTS

DE        3422502 A1 * 1/1986

OTHER PUBLICATIONS

Occhionero et al., "Aluminum Silicon Carbide (AlSiC) Microprocessor Lids and Heat Sinks for Integrated Thermal Management Solutions", 2000 HDI Conf., Denver, CO, Apr. 25–28, 2000, pp. 1–5.

Occhionero et al., "Cost–Effective Manufacturing of Aluminum Silicon Carbide (AlSiC) Electronic Packages", Proc. of the IMAPS Advanced Packaging Materials Symposium, Braselton, GA, Mar. 14–17 1999, pp. 1–7.

Occhionero et al., "Aluminum Silicon Carbide (AlSiC) Thermal Management Packaging for High Density Packaging Applications", Proc. for Int'l Conf. On High Density Packaging and MCM's, Denver, CO, Apr. 6–9, 1999, pp. 1–6.

Occhionero et al., "Aluminum Silicon Carbide (AlSiC) for Thermal Management Solutions and Functional Packaging Designs", Proc. of the Annual IMAPS Conf, San Diego, CA, Oct. 31–Nov. 4, 1998, pp. 1–8.

Occhionero et al., "Aluminum Silicon Carbide (AlSiC) for Advanced Microelectronic Packages", Proc. of the 25$^{th}$ Annual IMAPS NE Symposium, Andover, MA, May 14, 1998, pp. 1–6.

Occhionero et al., "A New Substrate for Electronics Packaging: Aluminum–Silicon Carbide Composites", Proc. of the Fourth Annual Portable by Des. Conf., Elect. Des., Mar. 24–27, pp. 1–6 (pp. 398–403).

Occhionero et al., "Aluminum Silicon Carbide (AlSiC) For Cost–Effective Thermal Management and Functional Microelectronic Packaging Design Solutions", 12$^{th}$ European Microelectronics and Packaging Conf., Jun. 7–9, 1999, 8 pp.

* cited by examiner

Primary Examiner—Kamand Cuneo
Assistant Examiner—Luan Thai
(74) Attorney, Agent, or Firm—Bernice Chen

(57) ABSTRACT

An integrated circuit device including an integrated circuit die having at least a first and a second heat-generating components formed thereon, and a heat dissipation structure thermally coupled to the die to dissipate heat generated by the components. The heat dissipating characteristics of the heat dissipation structure are tailored to match the heat generated by each of the first and second components.

31 Claims, 9 Drawing Sheets

INTEGRATED CIRCUIT COMPONENT TEMPERATURE GRADIENT REDUCER

CROSS-REFERENCE TO RELATED APPLICATIONS

The subject matter of the present application is related to that of co-pending U.S. patent application Ser. No. 09/642,180 for "INTEGRATED CIRCUIT COMPONENT TEMPERATURE GRADIENT REDUCER", filed concurrently herewith by inventors Marlin R. Vogel and Shlomo D. Novotny and assigned to the assignee of the present application, the disclosure of which application is herein incorporated by reference in its entirety.

FIELD OF THE INVENTION

This invention relates to heat dissipation of an integrated circuit (IC) device, in particular, to reducing the temperature gradient of an IC device. The invention also relates to heat dissipation in multi-chip modules.

BACKGROUND OF THE INVENTION

As the desire for processing intensive applications increases, so does the demand for electrical systems that operate at faster speeds, occupy less space, and provide more functionality. To meet these demands, manufacturers design increasingly more powerful modules containing numerous components residing in relatively close proximity on a common substrate (e.g., an integrated circuit board). With increasing heat dissipation from microelectronics devices and reduced overall form factors, thermal management becomes increasingly important because both performance reliability and life expectancy of electronic equipment are inversely related to the component temperature of the equipment. Long life and reliable performance of a device, therefore, may be achieved by effectively controlling the device operating temperature. A typical worst-case operating temperature for a complex electronic device such as a microprocessor or an application specific integrated circuit (ASIC) device is 105° C. (degrees Celsius).

Heat dissipation is a well-known technique for controlling operating temperatures. Heat dissipation may be accomplished in various ways such as transferring the heat to a heat-conducting medium, for example, air or liquid coolant. Due to the expense and complexity associated with active liquid cooling systems, air is typically used as the cooling medium. However, liquid cooling has the advantages of better performance, lower junction temperature and more compact size.

Dissipation of heat, either by air or liquid, often requires a series of physical interfaces to provide a thermally conductive path. These interfaces typically offer minimum resistance to heat flow and provide electrical isolation. In many applications, dissipation of the heat is aided by the use of heat spreaders and heat sinks, as shown in FIG. 1.

In FIG. 1, a heat sink 22 is attached to an integrated circuit device package 10 via an adhesive 20. Integrated circuit device package 10 contains an integrated circuit die 14 with circuitry components 12 formed thereon. A heat spreader/lid 18 is attached to integrated circuit die 14 on the opposite side of components 12 with an adhesive 16. An integrated circuit device package body 26 encloses/encapsulated integrated circuit die 14. Pins 28 provide electrical connection between integrated circuit die 14 and external circuitry (not shown). The heat generated by the operation of components 12 is dissipated to cooling medium 24 through heat spreader/lid 18, adhesives 16 and 20 and heat sink 22. For an air-moving cooling system, a fan (not shown) blows air onto heat sink 22 to transfer heat from heat sink 22 to the air in the surrounding atmosphere.

Heat sink 22 typically has substantially planar surfaces 22a and 22b and uniform thickness. In addition, traditional heat sinks are typically attached to the surface of package 10 which typically has a substantially planar surface 10a. Thus, heat sink 22 typically reduces the temperature uniformly throughout die 14. However, the various circuitry components 12 often generate different amounts of heat due to various power dissipation levels of components 12. The non-uniformity of heat dissipation causes temperature gradient/variation from one region to another on die 14. Temperature gradient is undesirable because it can result in adverse thermal gradients, causing excessive thermal stress and timing issues.

Heat sink 22 and heat spreader/lid 18 are often constructed from copper tungsten (CuW) or aluminum silicon carbide (AlSiC) which has a thermal conductivity of approximately 200 W/meter·K. Copper tungsten or aluminum silicon carbide may not provide adequate thermal conductivity for high performance integrated circuit devices. High conductivity structural materials may be created using composites which are materials having two or more different materials bonded together.

FIG. 2 shows an IC device with a composite heat dissipation structure which is composed of three layers. Specifically, composite heat dissipation structure 54 is composed of, e.g., a 0.5 mm thick lower layer 54a, a 0.5 mm thick upper layer 54c, and a 0.5 mm thick middle layer 54b sandwiched in between.

Lower layer 54a and upper layer 54c are constructed from aluminum silicon carbide (AlSiC) which provides strength and stiffness to the structure. Middle layer 54b is constructed from high grade graphite such as K1100 manufactured by Amoco which enhances heat dissipation of the structure. High grade graphite structure is typically constructed by layering high conductivity fibers, thus yields anisotropic properties which may be undesirable. For example, the high grade graphite structure has high thermal conductivity in the longitudinal direction (e.g., approximately 1600 W/m·K) but poor thermal conductivity in the vertical direction (e.g., approximately 10 to 20 W/m·K). As a result, high graphite is a good material in spreading heat along the structure in the longitudinal direction but is a poor conductor in transferring heat vertically to the surface of the heat dissipation structure.

Composite heat dissipation structure 50 also does not provide compensation for temperature gradients. As such, the temperature gradient can result in unacceptable maximum junction temperature, causing excessive thermal stress and timing issues and thereby resulting in fatigue and mechanical failure and speed limitations of the integrated circuit device.

SUMMARY OF THE INVENTION

The invention relates to methods and apparatus for dissipating heat from an integrated circuit device that minimize or eliminate temperature gradients on an integrated circuit die.

In accordance with the invention, a heat dissipating structure thermally coupled to the die has heat-dissipating characteristics tailored to match the heat-generating level of the most-proximate region of the die. In one embodiment, the heat dissipation structure may be a composite composed of a layer having various portions, each tailored to the heat-generating characteristics of the various regions of the die. For example, one portion may be formed of a material that provides relatively high isotropic conductivity and another portion may be formed of a material that provides high thermal conductivity in another direction. Because the portions of material have different heat-dissipating characteristics, they can be chosen to preserve uniformity across the integrated circuit. In one embodiment, the heat dissipation member further includes a second layer and a third layer, the first layer being sandwiched in between. The second and third layers may provide mechanical strength and stiffness for the heat dissipation member.

In one embodiment, at least one gap is formed between the integrated circuit device package and a heat dissipation member at a location corresponding to regions of various temperatures across the die. The gap increases the separation between the heat dissipation structure and the region of low-heat generation. The height of the gap may be inversely proportional to the heat generation level of the most proximate region of the die. For example, the distances of the gaps are larger at low power dissipation regions (where the IC is relatively cooler) than the distances of the gaps at high power dissipation regions (where the IC is relatively hotter). This allows the lower power dissipating regions of the integrated circuit die to increase in temperature so that they approach the temperature level of the higher power dissipating regions of the integrated circuit die, thereby normalizing the temperature of the integrated circuit die.

The gaps may be formed by shaping the mating surfaces of the heat dissipation member and/or a surface of the integrated circuit die. Alternatively, the gaps may be formed by shaping the upper surface of the package. Alternatively, the gaps may be formed by tailoring the shape of the mediate layers disposed between the heat dissipation member and the upper surface of the package. The gaps may also be formed by the insertion of additional materials at defined points between heat dissipation member and the package. Alternatively, they may be formed by shaping the surface of the die.

Other ways of tailoring the heat dissipating characteristics of the heat dissipation member, such as altering the heat-dissipating characteristics of the intervening layers, are also contemplated.

Additional heat dissipation members may be added to the structure with tailored heat-dissipating characteristics to further normalize the temperature of the integrated circuit die. The above techniques may be utilized for single-chip or multiple-chip packages.

This summary is not intended to limit the scope of the invention which is defined solely by the claims attached hereto.

Figure 1:
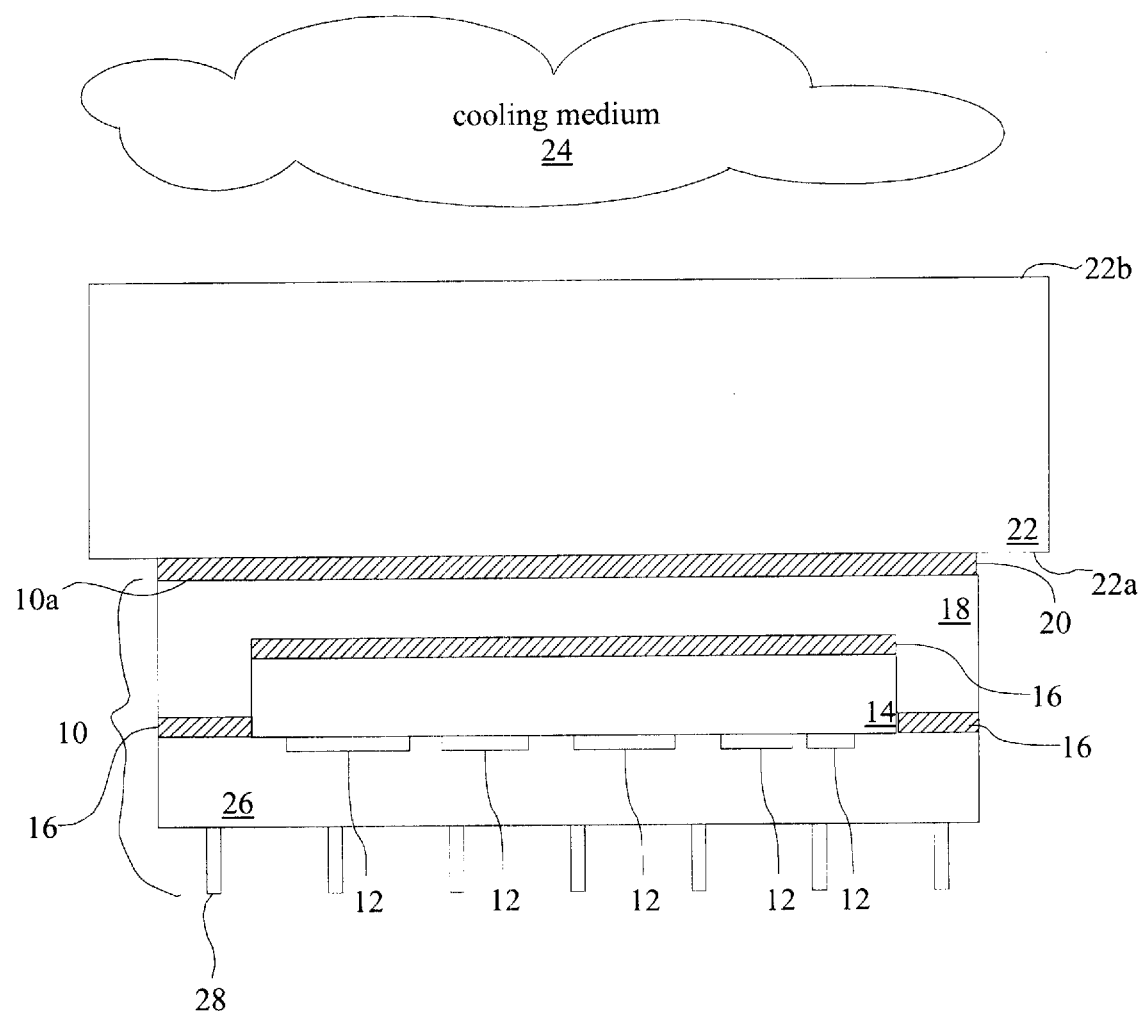
FIG. 1 shows a conventional heat dissipation system according to the prior art.
Figure 2:
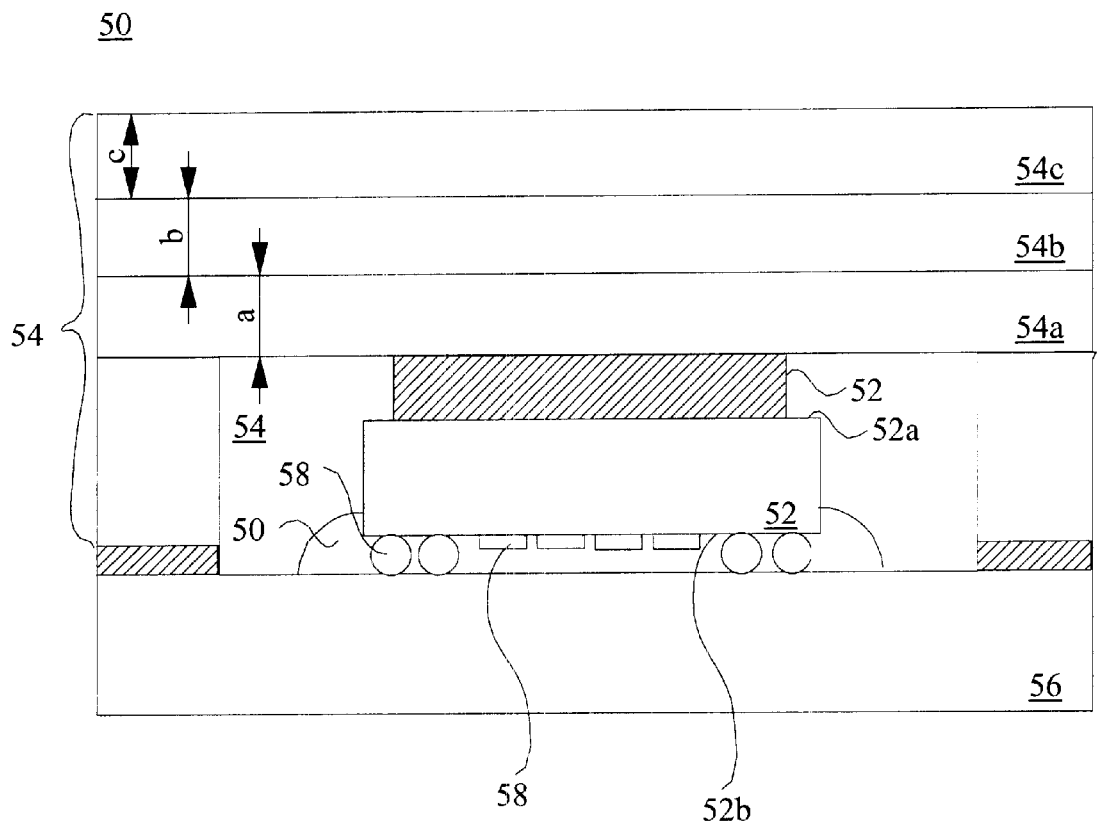
FIG. 2 shows a conventional composite heat dissipation structure according to the prior art.

While the invention is susceptible to various modifications and alternative forms, specific embodiments thereof are shown by way of example in the drawings and will be described in detail.

DETAILED DESCRIPTION OF THE INVENTION

Figure 3:
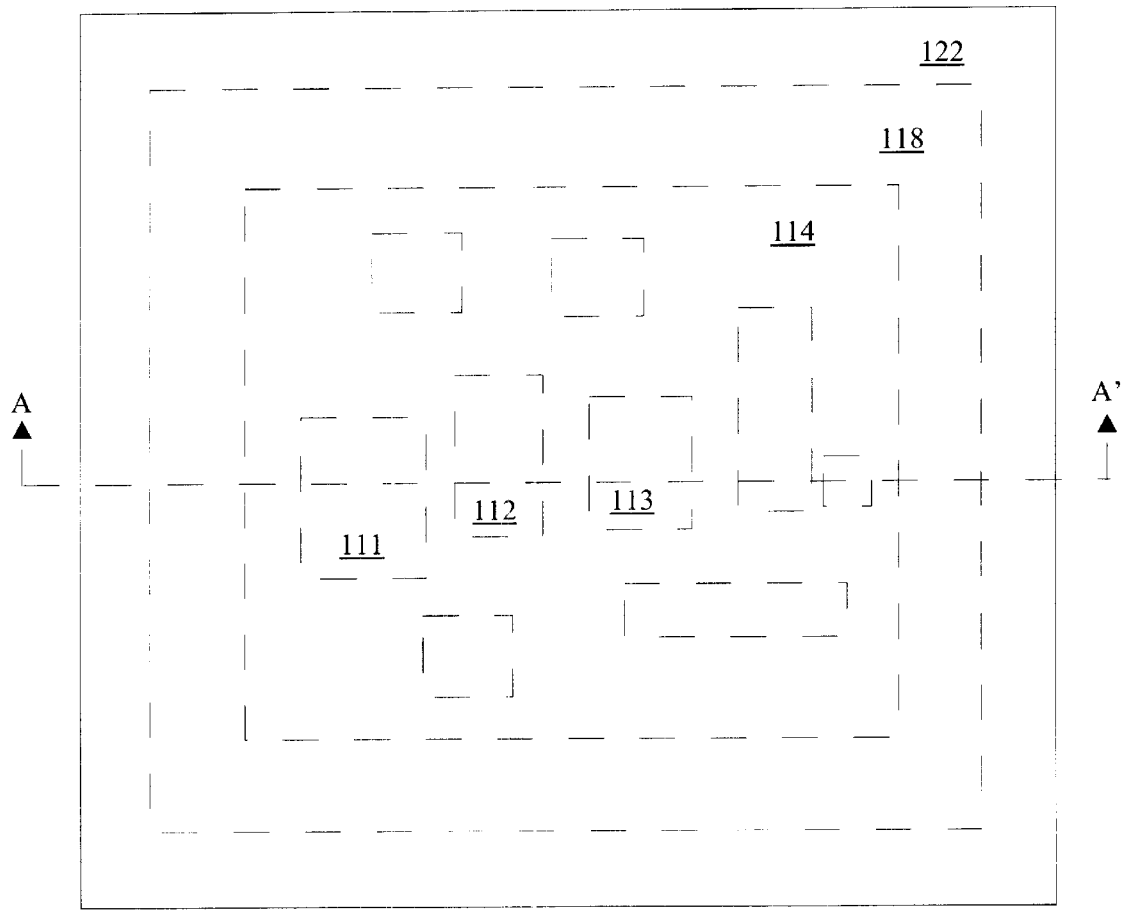
FIG. 3 shows a top view of a heat dissipation system according to the present invention.
Figure 4:
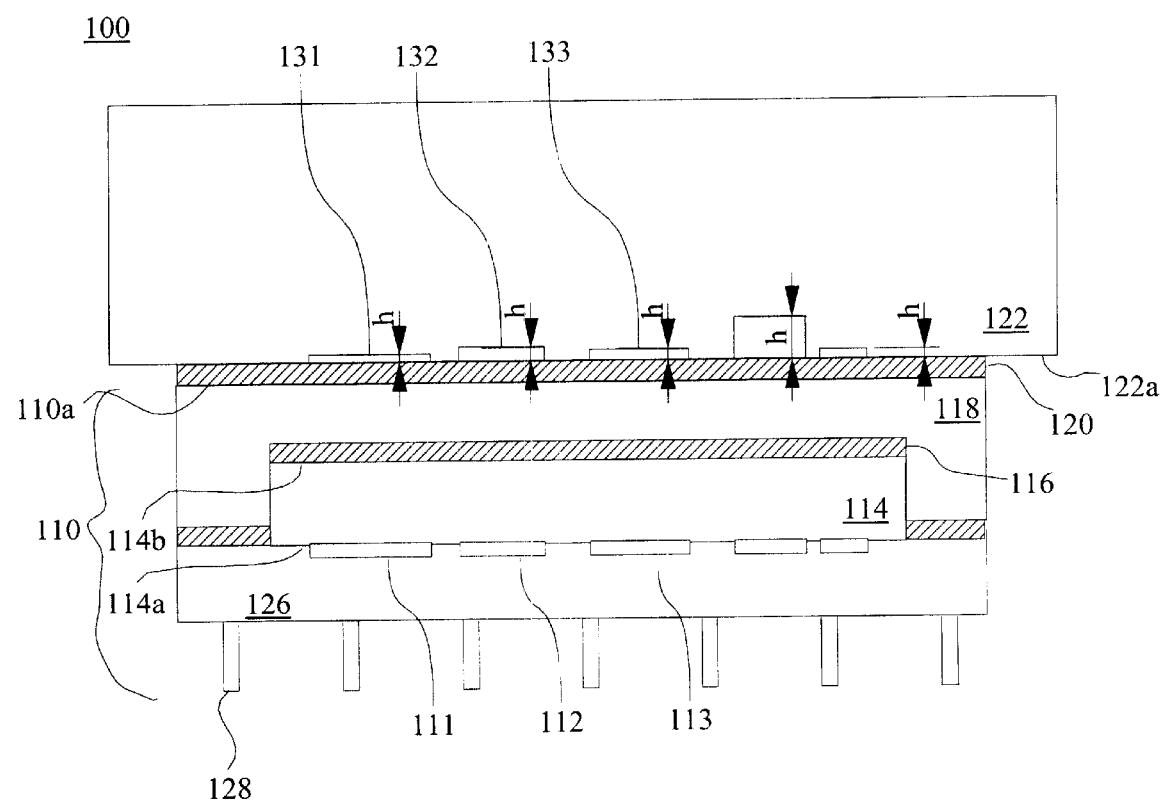
FIG. 4 shows a cross sectional view of the system of FIG. 3 where a heat sink is shaped to in de thermal interface gaps.

Methods and apparatus for normalizing temperature at various power dissipating regions of an integrated circuit die are provided. FIG. 3 shows a top view of a heat dissipation system in accordance with the present invention. FIG. 4 shows a cross-sectional view of the heat dissipation system shown in FIG. 3, taken along line A-A'.

Integrated circuit device 100 is illustrated in FIG. 3 and FIG. 4. Electronic device package 110 contains a semiconductor die 114, having circuit components 111, 112, 113 formed thereon. Die 114 may be, for example, a microprocessor or application specific integrated circuit (ASIC), with components 111, 112, 113 being processing blocks or sub-blocks (such as a Memory Management Unit (MMU), or Arithmetic Logic Unit (ALU), for example), of the overall circuitry. Circuit components 111, 112, 113 may be any other component of an integrated circuit, such as arrays, peripheral circuitry, registers, power circuits, transistors, resistors, capacitors, and so forth. Semiconductor die 114 may be made of, for example, silicon or gallium arsenide. Circuit components 111, 112, and 113 are formed on an active side 114a of semiconductor die 114 via conventional semiconductor processing means.

During electrical operation of integrated circuit device 100, circuit components 111, 112, 113 may generate heat. The heat generated by each of circuit components 111, 112, 113 may vary from component to component, depending on the type of components, the components' use in the overall integrated circuit, the size of the components, etc. This variance in heat generation results in differences in the heat generation level from region to region on semiconductor die 114.

Semiconductor die 114 is encapsulated in device package 110 which comprises a heat dissipation structure 118 and package body 126. An inactive side 114b of semiconductor die 114 may be attached to heat dissipation structure 118 using an interface material 116. Device package 110 may be any type of semiconductor device package, including for example, lead frame and package cases (e.g., flip-chip, Ball Grid Array (BGA), etc.). Device package 110 contains semiconductor die 114 and provides electrical connectivity between semiconductor die 114 and external circuits (not shown).

In one embodiment, heat dissipation structure 118 may include an optional heat spreader attached to inactive side 114b of die 114 through interface material 116. The heat spreader enhances heat dissipation for the various components on semiconductor die 114. The heat spreader is typically made of a metal, for example, copper-tungsten, copper, or aluminum. Copper-tungsten has the advantage of having a similar coefficient of thermal expansion as a silicon substrate. Alternatively, the heat spreader may be made of a plastic containing high conductivity carbon fibers. In general, the heat spreader has a conductivity of approximately 200 watts/meter-K. Heat dissipation structure 118 may be a lid of similar conductivity or it may be a combination of a lid and a heat spreader.

Interface material 116 may be any conventional adhesive (paste or tape), grease, solder material or other means of attaching semiconductor die 114 to heat dissipation structure 118. In general, interface material 116 should have high dielectric strength, high thermal conductivity and sufficient pliancy to conform to both microscopic and macroscopic surface irregularities of semiconductor die 114 and heat dissipation structure 118. Interface material 116 should also be sufficiently durable to survive a variety of assembly, use, and environmental conditions. The optimal interface material for a specific application generally depends on volume production requirements, processing limitations, and functional and performance requirements (e.g., thermal transfer rates vs. cost). Some examples of interface material 116 are thermal greases, pads and adhesives with filler materials (i.e., conductive metal particles) such as, but not limited to, zinc oxide, silver, aluminum, aluminum oxide, aluminum nitride, boron nitride, magnesium oxide, and diamond. Other suitable interface materials may also be used. The thickness of interface material 116 needs to be enough to bond semiconductor die 114 and heat dissipation structure 118 together, but the exact amount depends on the type of the interface material chosen and the specific application.

A heat sink 122 is attached to heat dissipation structure 118 with an interface material 120. Heat sink 122 enhances heat dissipation from a hot surface, e.g., electronic device package 110, to a cooler ambient, e.g., air, by increasing the surface area that is in direct contact with the cooling medium. The surface area of heat sink 122 is generally at least as large as surface 114b of die 114. However, in some applications, the periphery of semiconductor die 114 may not need to be in direct contact with the heat sink for adequate heat dissipation. Thus, mating surface 122a may have a smaller area than surface 114b. It is noted that the primary purpose of heat sink 122 is to maintain the device temperature below the maximum allowable temperature specified by the device manufacturer. Therefore, the selection of heat sink 122 is again application dependent.

In accordance with the present invention, heat sink 122 may be any conventional heat sink and may be either air cooled or liquid cooled. For example, heat sink 122 may be manufactured by various processes (e.g., stamping, casting) and made from various materials (e.g., aluminum, copper, bronze). Generally, heat sink 122 should be constructed such that it has a high coefficient of thermal conduction and is of a shape that is adapted to convect or radiate heat at a high rate.

Heat sink 122 should preferably be secured to and placed in good thermal contact with electronic device package 110. In one embodiment, heat sink 122 is glued or otherwise adhesively attached to a predetermined surface of electronic device package (e.g., surface 110a) with a heat-conductive interface material 120 which allows removal of heat from the electronic device package 110. Interface material 120 between heat sink 122 and heat dissipation structure 118 may be similar to interface material 116 between semiconductor die 114 and heat dissipation structure 118. For instance, interface material 120 may be any conventional adhesive (paste or tape), grease, or solder material, the exact amount and material being application specific. Heat sink 122 may also be mechanically attached to electronic device package 110, for example, using clips (not shown). The clips enable the heat sink to be easily removed from the electronic device package.

In one embodiment, various surface treatments may be applied to the exterior surfaces of heat sink 122. Such surface treatments may include, but are not limited to, anodization, electrodeposition, diffusion coating, galvanization, cladding, sprayed metal or paint coatings and conversion coatings as well as various forms of enamels, plastics, rubbers and vacuum-deposited coatings. These treatments are beneficial in that they protect the heat sinks from corrosion caused by moisture or other materials in the environment. In addition, certain of the surface treatments described above enable the heat sinks to be selectively colored which may enhance heat dissipation. For example, darker colors enhance the ability of the heat sinks to radiate heat to the atmosphere during use.

According to one embodiment of the present invention, the thermal characteristics of the various layers between heat-generating circuit components 111, 112, 113 and heat sink 122 are tailored to match the heat-generating level of the most proximate circuit component. In this way, semiconductor die 114 can be uniformly cooled by heat sink 122, irrespective of non-uniformities in the heat generated by each of circuit components 111, 112, 113.

In accordance with one embodiment of the present invention, the mating heat sink surface 122a of heat sink 122 is shaped such that thermal interface gaps (e.g., thermal interface gaps 131, 132 and 133) are formed between electronic device package 110 and heat sink 122. The heights (denoted "h" in FIG. 4) of thermal interface gaps are larger in regions where electronic device package 110 is generating lower power densities than the distances of thermal interface gaps at higher power dissipating regions. This allows the lower power dissipating regions of electronic device package 110 to increase in temperature so that they approach the temperature level of the higher power dissipating regions of electronic device package 110, thereby normalizing the temperature across semiconductor die 114.

For example, where circuit component 111 generates more heat than other circuit components on semiconductor die 114 (e.g., more heat than circuit components 112 and 113), the region around circuit component 111 has higher power density than regions around components 112 and 113, i.e., a hot spot. Thermal interface gap 131 which is the most proximate to circuit component 111 (and thus the hot spot), should be minimal (or nonexistent) while thermal interface gaps 132 and 133 should be larger. Typically, the minimal gap (e.g., height d) above the hot spot is approximately 0.001 inches to approximately 0.002 inches. The heights of the gaps increase over regions of the IC having lower temperatures than the hot spot. For example, thermal interface gaps 132 and 133 may have heights that are approximately 2 to 20 times of the height of thermal interface gap 131, depending on the application and the heat-generating characteristics of the circuit components chosen.

In one embodiment, where inactive side 114b of semiconductor die 114 includes multiple hot spots, mating surface 122a of heat sink 122 may be shaped to accommodate multiple hot spots. It is also noted that the areas of the thermal interface gaps do not have to be the same as the areas of the corresponding circuit components. It is noted that the shape of electronic device package 110, heat dissipation structure 118 and heat sink 122 may take on shapes other than rectangular.

The thermal interface gaps on surface 122a in heat sink 122 may be machined or milled using conventional processing means, for example, electrical discharge machining (EDM). EDM is a material removal technique which uses electricity to remove metal by means of spark erosion and has the advantages of accuracy, flexibility, and fine finishes. However, other techniques may be used to obtain the thermal interface gaps.

Figure 5:
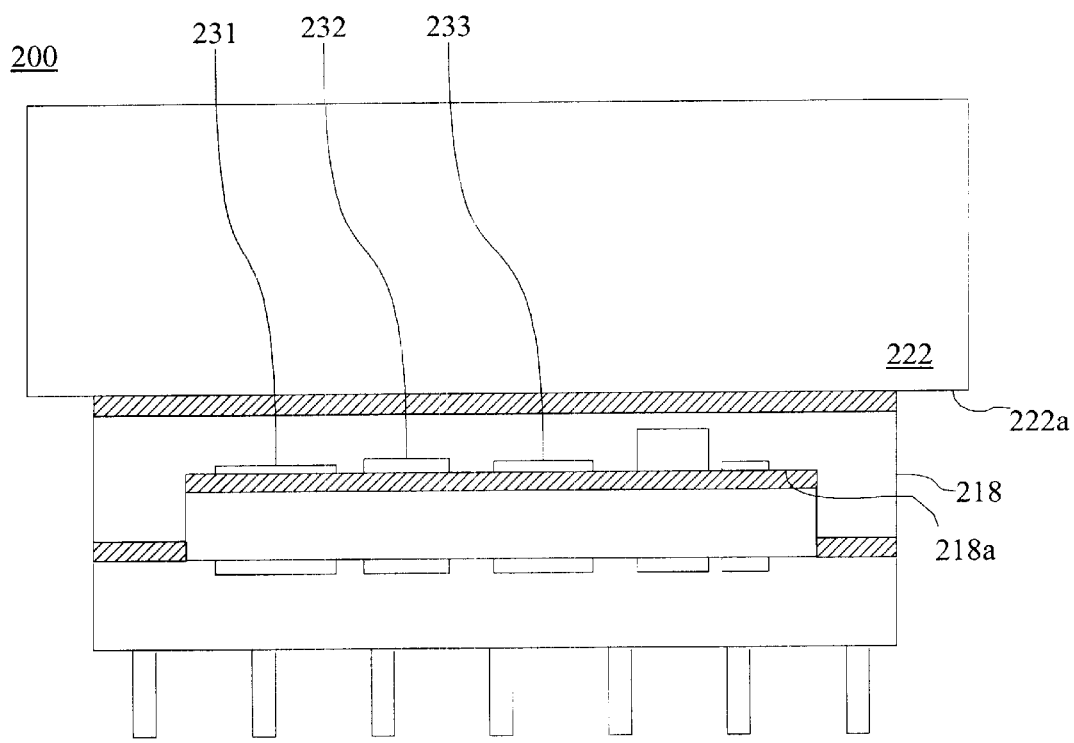
FIG. 5 shows a cross sectional view of a heat dissipation system having a heat spreader shaped to include notches for forming thermal interface gaps.

FIG. 5 shows an alternative embodiment where mating surface 218a of heat dissipation structure 218 is shaped to form thermal interface gaps 231, 232, 233 while heat sink 222 is a conventional heat sink having a planar mating surface 222a. Again, the locations and the dimensions of the thermal interface gaps may be similar to those described above.

Figure 6:
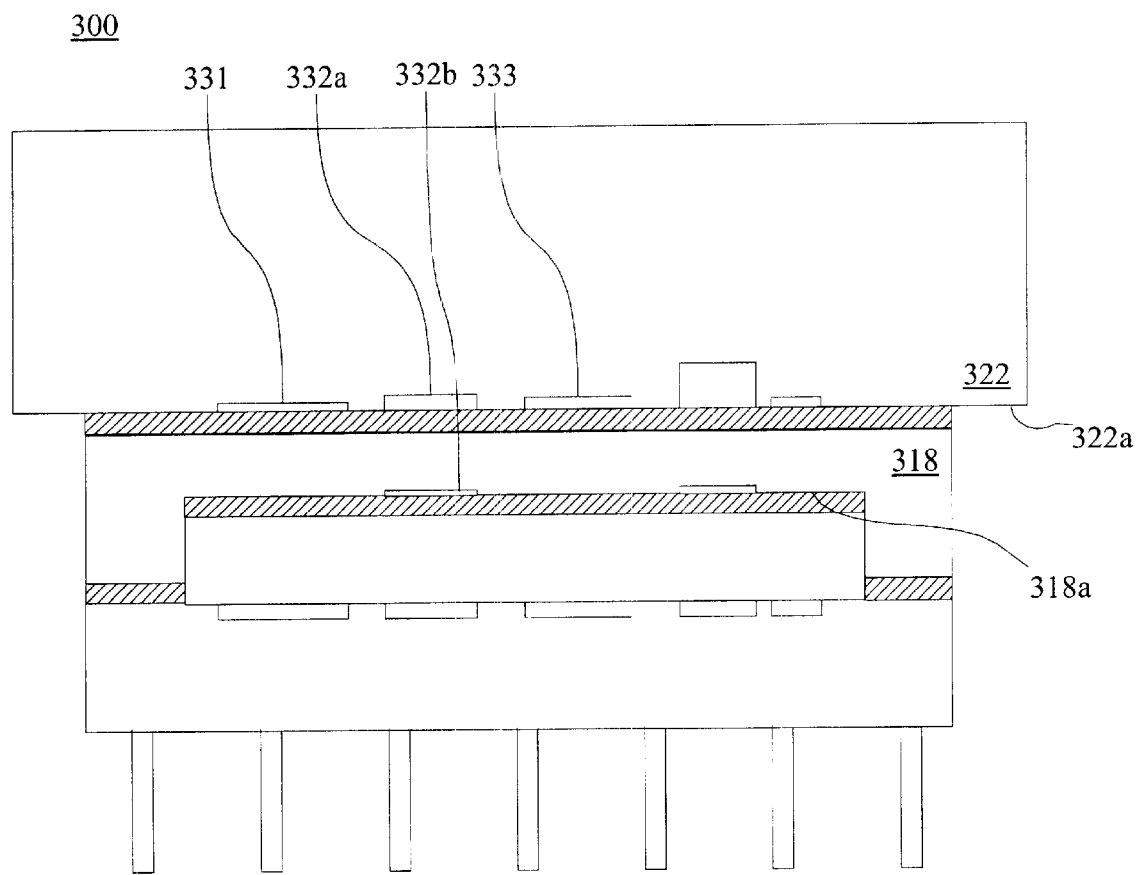
FIG. 6 shows a cross sectional view of a heat dissipation system having a heat spreader and a heat sink, both shaped to include notches for forming thermal interface gaps.

FIG. 6 shows another embodiment where mating surface 322a of heat sink 322 is shaped to include thermal interface gaps 331, 332a, 333 and heat dissipation structure 318 is shaped to form thermal interface gaps 332b. In this embodiment, heat dissipation structure 318 may be shaped for fine-tuning temperature gradient normalization, for example, when heat sink 322's thermal interface gaps have reached maximum heights. In the alternative, heat sink 322 may be shaped for fine-tuning temperature gradient normalization when heat dissipation structure 318's thermal interface gaps have reached, for example, maximum heights.

Figure 7:
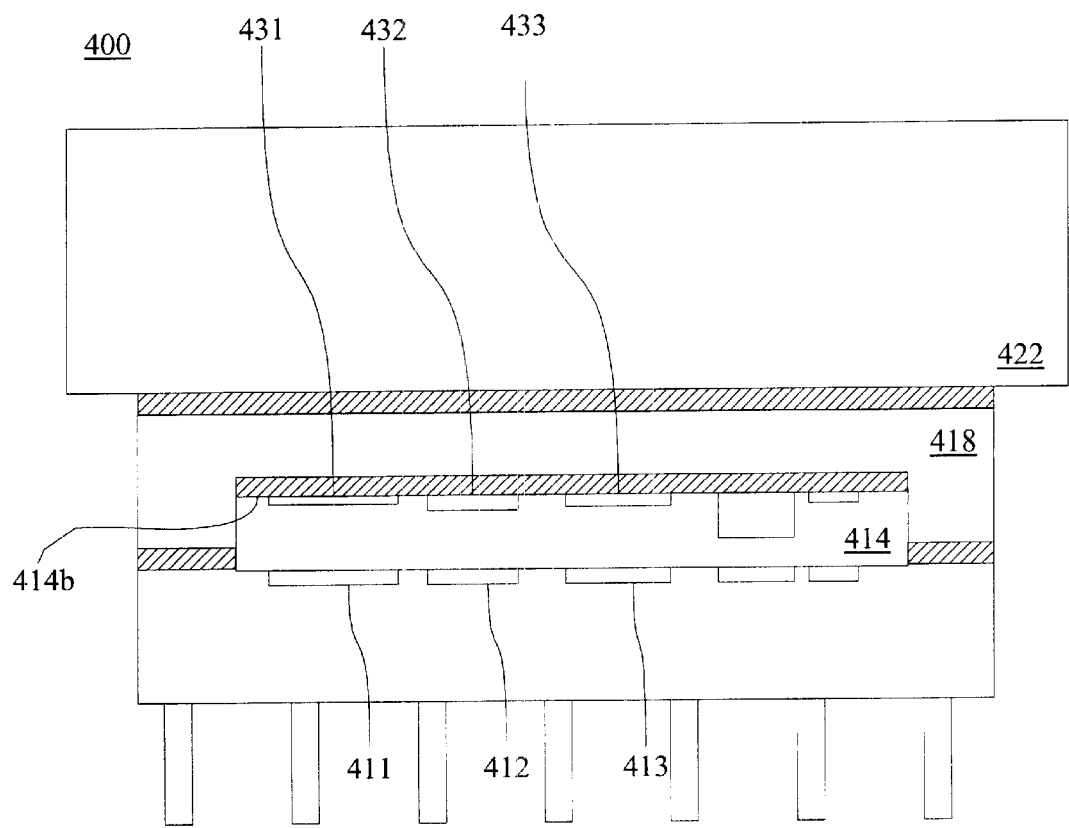
FIG. 7 shows a cross sectional view of an integrated circuit device where the mating surface of the die is shaped to include notches for forming thermal interface gaps.

FIG. 7 shows an embodiment where surface 414b of die 414 is shaped to include notches at positions corresponding to heat dissipation of the circuit components (e.g., components 411, 412, and 413) so that thermal interface gaps (e.g., thermal interface gaps 431, 432, and 433) are formed between heat dissipation structure 418 and die 414. The notches in die 414 may be formed, for example, by etching or machining, as described above or other techniques for varying the back-side of an IC die. The positions and dimensions of the thermal interface gaps may be similar to those described above. A person of ordinary skill in the art will appreciate that heat sink 422 and heat dissipation structure 418 may also be shaped to further normalize the die temperature.

The present invention includes other embodiments in which the thermal characteristics of the layers between semiconductor die 114 and heat sink 122 may be modified to match the location of hot spots. For example, interface materials 116, 120 may be made of a patchwork of materials, with high thermal-conductivity materials overlying hot spots and lower thermal-conductivity materials overlying other regions of semiconductor die 114. In such embodiments, the patchwork of different materials could be formed integrally as part of interface materials. Alternatively, the interface materials may comprise a stack of several interface layers, some of which have holes or openings in positions corresponding to underlying hot spots. Other variations are also contemplated.

Figure 8:
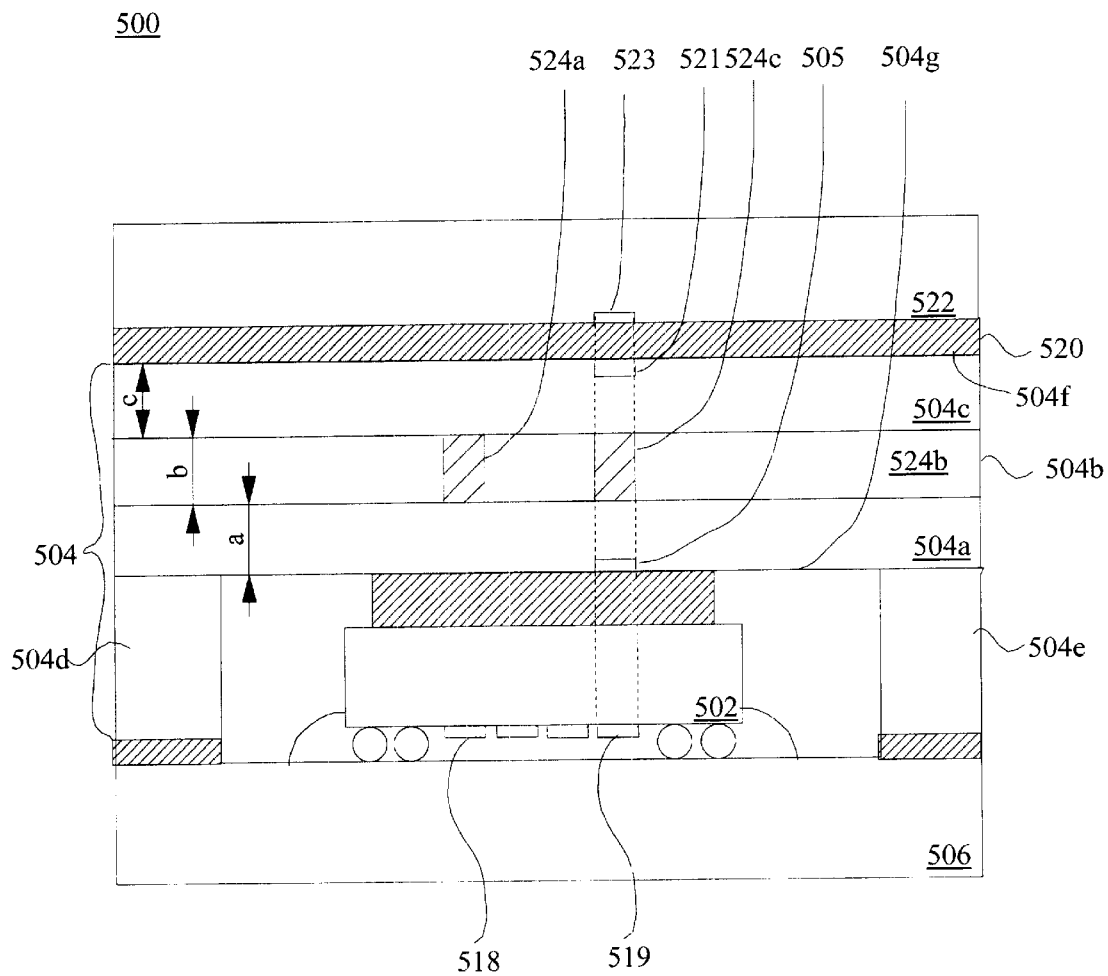
FIG. 8 shows an integrated circuit device having a composite heat dissipation structure in accordance with one embodiment of the invention.

FIG. 8 shows an integrated circuit device 500 having a composite heat dissipation structure 504 in accordance with one embodiment of the invention. Semiconductor die 502 is mounted in a conventional flip chip configuration which includes integrated circuitry fabricated on a monocrystalline silicon substrate. Die 502 has a plurality of circuit components 518 and 519 formed thereon and is encapsulated between a package body (i.e., interconnect structure 506) and a package lid 504.

In accordance with one embodiment of the present invention, lid 504 may be composed of three layers, namely, a lower layer 504a, an upper layer 504c, and a middle layer 504b sandwiched between lower layer 504a and upper layer 504c. Lower layer 504a and upper layer 504c form the surface skins of lid 504. Lower layer 504a and upper layer 504c help to define thermal expansions and mechanical properties such as strength and stiffness, of lid 504. Lower layer 504a and upper layer 504c may be constructed from any compatible materials with sufficient temperature range capability for a particular application. It is noted that lower layer 504a and upper layer 504c assist in defining the plane thermal expansion of composite lid 504, hence the materials chosen for lower layer 504 and upper layer 504c should meet the system thermal expansion requirements. In one embodiment, lower layer 504a and upper layer 504c may be constructed from aluminum silicon carbide (AlSiC), copper, aluminum, copper tungsten, bronze or any suitable conductive material that has a similar coefficient of thermal expansion as the coefficient of thermal expansion of the substrate, e.g., silicon, sufficient conductivity and stiffness. Thicknesses a and c of lower layer 504a and upper layer 504c, respectively, may be approximately 0.5 mm, but depend on the materials chosen. In general, thickness of lower layer 504a and upper layer 504c should be sufficient to provide structural integrity for composite lid 504.

Aluminum silicon carbide has a high thermal conductivity and coefficient of thermal expansion value that is compatible with most IC devices. Similar coefficient of thermal expansion is important because a significant difference in coefficients of thermal expansion between components, temperature changes arising from soldering and heat generated in the system during operation can cause large thermal stresses. Such stresses may cause, in turn, premature component failure leading to reduced component reliability. In addition, aluminum silicon carbide has low material density which makes it a good material for weight sensitive applications such as portable devices.

Lower layer 504a and upper layer 504c may be formed by first creating a porous SiC particulate preform which is net-shape fabricated using, e.g., the QuickSet™ low pressure injection molding process of Ceramics Process Systems, Inc., to a controlled SiC content. The porous preform has the geometrical attributes of the final package including cavities, holes and notches. The porous SiC preform is then inserted into a mold which has the dimensions of final part for QuickCast™ infiltration process. Using pressure assistance, molten Al-metal infiltrates the porous SiC preform. The infiltration process results in a material which is completely dense and is hermetic. After Quick-Cast™ infiltration, circuit components can be plated using conventional plating schemes to allow for assembly and integration operations. Lower layer 504a and upper layer 504c may have same or different material composition. Lower layer 504a and upper layer 504c may also have same or different thickness.

Middle layer 504b, in one embodiment, includes a first portion 524a, a second portion 524b, and a third portion 524c In the embodiment shown, portion 524b is made of a material that has high thermal conduction in the longitudinal direction (i.e., isotropic conductivity in x and y directions). For example, portion 524b may be constructed from a high grade graphite such as K1100 manufactured by Amoco or high conductivity thermal pyrolytic graphite (TPG) materials manufactured by Advanced Ceramics Corporation. Graphite has high thermal conductivity that is directional dependent, e.g., graphite is a good thermal conductor in x and y directions but a poor thermal conductor in the z direction. Thus, graphite is a good "heat spreader" for spreading heat to the periphery but does not conduct heat to the surface effectively. Therefore, other means are needed to conduct heat in the z direction (or to the surface). It is noted that high grade graphite material is typically brittle and does not hold up well to impact. However, since graphite is used in the middle layer which does not need to provide structural integrity, the brittleness of graphite is not critical in this particular embodiment.

Portion 524a is positioned at a location corresponding to a high power dissipation component 518 (above it in the orientation of FIG. 8) and is made of a slug having high thermal conductivity that compliments thermal conductivity provided by portion 524b. For example, portion 524a may be made of copper, aluminum, copper tungsten, diamond or other suitable materials. In general, portion 524a should be made of a material having good thermal conductivity in the vertical direction or in a direction that compliments the thermal conduction direction of portion 524b. In other words, portion 524a and portion 524b should be blended to obtain optimal thermal conduction in all directions, i.e., x, y and z directions. Since lower layer 504a and upper layer 504c provide the necessary strength and stiffness for composite heat dissipation structure 504a, middle layer 504b does not need to have significant strength or stiffness.

In contrast to portion 524a, portion 524c is positioned at a location corresponding to a low power dissipation component 519 (above it in the orientation of FIG. 8) and is made of a material that has lower thermal conductivity than portion 524a.

Thickness b of middle layer 504b (including portion 524a, portion 524b, and potion 524c) generally depends on system requirement. In one embodiment, thickness b is approximately 0.5 mm. Middle layer 504b may be formed using any suitable methods.

Portion 524a, portion 524b, and portion 524c should be blended to obtain a uniform temperature on semiconductor chip 502. For example, portions 524a, 524b and 524c are located such that portion 524a is located at a higher heat density area, e.g., a location proximate integrated circuit component 518 which generates a hot spot or a region with the highest temperature; portion 524c is located at a lower heat density area, e.g., a location proximate integrated circuit component 519 which generates low heat; and portion 524b is at the remaining areas.

In one embodiment, a surface 504g of composite thermally conductive structure 504 is shaped such that a thermal interface gap 505 is formed proximate a region with low heat density, for example, proximate integrated circuit component 519. Thermal interface gap 505 further normalizes the thermal gradient on die 502 because it allows the lower power dissipating regions of the integrated circuit die to increase in temperature so that they approach the temperature level of the higher power dissipating regions of the integrated circuit die. For a semiconductor chip having multiple hot spots, multiple thermal interface gaps may be formed. The height of thermal interface gaps depend on the amount of heat at various regions, i.e., inversely proportional to the heat density. Thermal interface gap 505 may be used to fine tune thermal gradient normalization while portion 524c does the rough tuning. In the alternative, portion 524c may be used for fine tuning thermal gradient normalization while thermal interface gap 505 does the rough tuning.

Heat dissipation structure 504 further includes portions 504d and 504e which may be integrated with or suitably attached to portion 504a. Composite heat dissipation structure 504 described above may be a lid, a heat spreader, a heat sink or any other suitable heat dissipation device.

An optional heat sink 522 may be attached to composite heat dissipation structure 504 through an interface material 520 to enhance heat dissipation of die 502 by increasing the surface area that is in direct contact with the cooling medium to allow more heat to be dissipated. In one embodiment, a mating surface of heat sink 522 is shaped such that thermal interface gaps, e.g., thermal gap 523, are formed. In one embodiment, an upper surface 504f is shaped to form a thermal interface gap 521. Thermal gaps 521 and 523 further normalize temperature gradient on die 502. Heat sink 522 may be a composite, similar to heat dissipation structure 504 described above.

Figure 9:
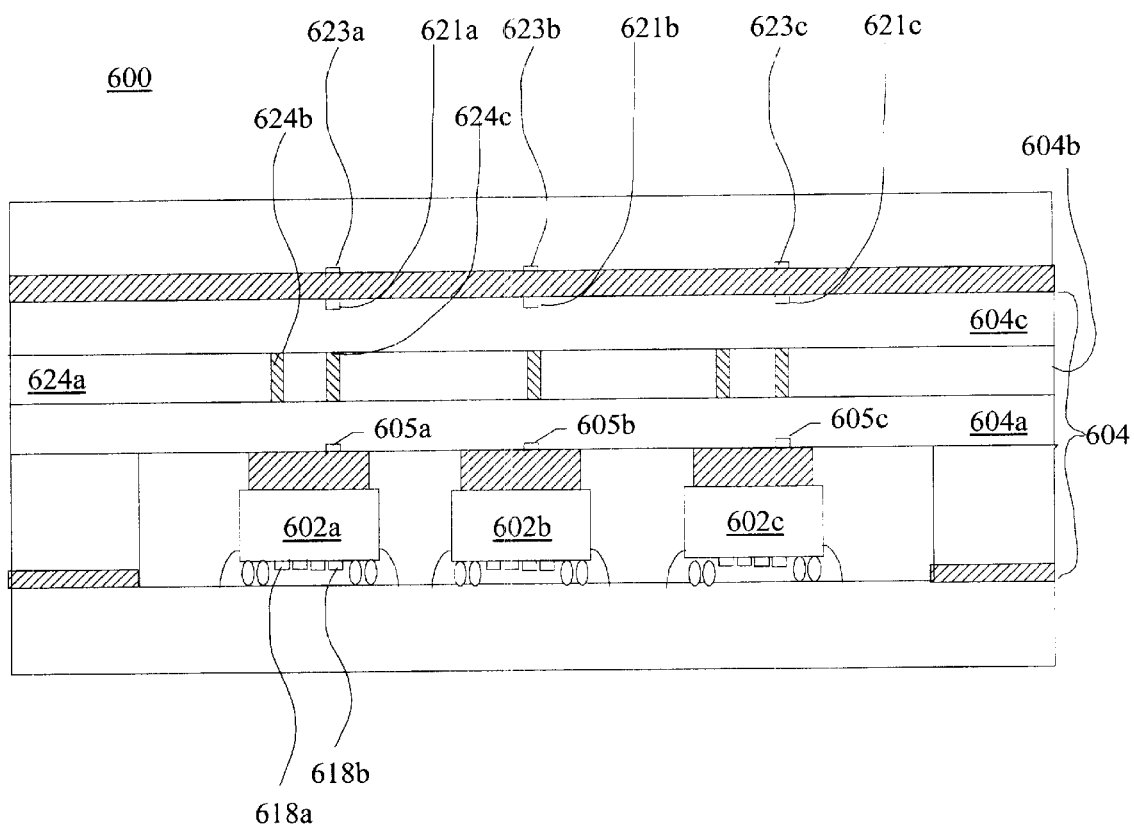
FIG. 9 shows a multi-chip package in accordance with one embodiment of the invention.

FIG. 9 shows a multi-chip package in accordance with one embodiment of the present invention. Integrated circuits 602a, 602b and 602c are mounted in a conventional flip chip configuration. Heat dissipation structure 604 may be composed of three layers and may be formed in a similar manner as described above for heat dissipation structure 504 (FIG. 8). Specifically, heat dissipation structure may be composed of three layers of which the middle layer 604b may include various portions made of materials having different power conduction characteristics. The various portions are positioned in accordance with the heat dissipation levels across the various integrated circuits (e.g., ICs 602a, 602b and 602c). For example, portion 624a may be made of a material that has high thermal conductivity in the longitudinal direction portion 624b may be positioned at a location corresponding to a high power component 618a (above it in the orientation of FIG. 9) and may be made of a material that has high thermal conductivity in a direction that compliments thermal conductivity provided by portion 624a; and portion 624c may be positioned at a location corresponding to a low power dissipation component 618b and may be made of a material that has lower thermal conductivity than portion 624b. In one embodiment, a surface of heat dissipation structure 604 may be shaped to form a thermal interface gap 605 proximate a region with low heat density (e.g., IC 618b) to further normalize the thermal gradient.

An optional heat sink 622 may be attached to e heat dissipation structure 604 through an interface material 620 to enhance heat dissipation of ICs 602a, 602b and 602c. A mating surface of heat sink 622 may be shaped to form thermal interface gaps 623a, 623b, and 624c. In one embodiment, a mating surface of the thermally conductive structure 604 may be shaped to form thermal interface gaps 621a, 621b and 621c. Thermal gaps 621a, 621b, 621c, 623a, 623b and 623c further normalize temperature gradients across the ICs. In one embodiment, heat sink 622 may be formed of a composite.

While the present invention has been described with reference to particular figures and embodiments, it should be understood that the description is for illustration only and should not be taken as limiting the scope of the invention. Many changes and modifications may be made to the invention, by one having ordinary skill in the art, without departing from the spirit and scope of the invention. For example, additional heat dissipation layers may be added to enhance heat dissipation of the integrated circuit device. Additionally, various packaging types and IC mounting configurations may be used, for example, ball grid array, pin grid array, etc. Furthermore, although the invention has been described in a particular orientations, words like "above," "below," "overlying," "beneath," "up," "down," "height," etc. should not be construed to require any absolute orientation.

We claim:

1. An integrated circuit device, comprising:
   an integrated circuit die having at least a first and a second heat-generating components formed thereon; and a heat dissipation structure thermally coupled to the die to dissipate heat generated by the components, the heat dissipation structure comprising a first portion overlying the first component and a second portion overlying the second component, the first potion and the second portion are formed of materials with different thermal conductivity properties, wherein heat dissipating characteristics of the heat dissipation structure are tailored to match the heat generated by each of the first and second components.

2. The integrated circuit device of claim 1, wherein the die comprises a first surface on which the components are formed and an opposite surface, and wherein the heat dissipation structure is coupled to the opposite surface of the die at an interface boundary.

3. The integrated circuit device of claim 1, wherein the first portion and the second portion provide high homogeneous thermal conductivity in different directions.

4. The integrated circuit device of claim 1, wherein the first component generates relatively high heat density and the first portion of the heat dissipation structure comprises a slug of high conductivity material.

5. The integrated circuit device of claim 4, further comprising a gap at an interface boundary between the die and the heat dissipation structure at a location corresponding to the heat generated by the components.

6. The integrated circuit device of claim 5, wherein the gap is formed in the die at the interface boundary.

7. The integrated circuit device of claim 5, wherein the gap is formed in the heat dissipation structure at the interface boundary.

8. The integrated circuit device of claim 1, wherein the first portion and the second portion form a first layer, the heat dissipation structure further comprises a second layer and a third layer, the first layer being sandwiched between the second layer and the third layer.

9. The integrated circuit device of claim 1, wherein the heat dissipation structure is selected from the group consisting of a lid, a heat spreader and a heat sink.

10. An integrated circuit device, comprising:
an integrated circuit die having at least one hot spot; and
a heat dissipation structure thermally coupled to the die, wherein heat dissipating characteristics of the heat dissipation structure are tailored to match heat generated by the at least one hot spot, and wherein the heat dissipation structure comprises a composite including a first layer, the first layer comprising a first portion comprising a first material and a second portion comprising a second material different from the first material, the first portion at a location corresponding to the hot spot.

11. The integrated circuit device of claim 10, wherein the heat dissipation structure further comprises a second layer and a third layer, the first layer being sandwiched between the second layer and the third layer.

12. The integrated circuit device of claim 10, wherein an interface boundary between the die and the heat dissipation structure includes a gap at a location corresponding to the hot spot.

13. An integrated circuit device, comprising:
an integrated circuit die having a plurality of regions, the plurality of regions having various temperatures, thereby producing temperature gradient on the integrated circuit die;
a heat dissipation member thermally coupled to the die at an interface boundary, wherein the heat dissipating characteristics of the heat dissipation member substantially normalize the temperature gradient and wherein the heat dissipation member comprises at least one notch at a location corresponding to the temperature such that at least one gap is formed between the die and the heat dissipation member; and
the heat dissipation member comprising a first portion and a second portion at locations corresponding to the temperature at the plurality of regions, the first portion and the second portion comprising different materials.

14. The integrated circuit device of claim 13, wherein the gap is formed in the die at the interface boundary.

15. The integrated circuit device of claim 13, wherein the gap is formed in the heat dissipation member at the interface boundary.

16. An integrated circuit device, comprising:
an integrated circuit die having at least one component formed thereon; and
a heat dissipation member thermally coupled to the integrated circuit die for dissipating heat generated by the at least one component, the heat dissipation member comprising a first layer having a first portion comprising a first material and a second portion comprising a second material, the first material having high thermal conductivity in a first direction and the second material having high thermal conductivity in a second direction that compliments the first direction such that thermal conduction is obtained in all directions.

17. The integrated circuit device of claim 16, further comprising a second layer and a third layer, the first layer being sandwiched between the second and the third layer.

18. The integrated circuit device of claim 17, wherein the first layer comprises materials having high thermal conductivity and the second and third layers comprise materials having high mechanical strength and stiffness.

19. The integrated circuit device of claim 17, wherein the second layer comprises aluminum silicon carbide.

20. The integrated circuit device of claim 17, wherein the third layer comprises aluminum silicon carbide.

21. The integrated circuit device of claim 17, wherein the second layer comprises a notch at a location corresponding to the location of the at least one component.

22. The integrated circuit device of claim 21, wherein the third layer comprises a notch at a location corresponding to the location of the at least one component.

23. The integrated circuit device of claim 10, wherein the first portion comprises graphite.

24. The integrated circuit device of claim 10, wherein the second portion comprises a material selected from the group consisting of copper, aluminum, copper tungsten, diamond and bronze.

25. A heat dissipation member, comprising:
a first layer having a first portion comprising a first material and a second portion comprising a second material, wherein the first portion and the second portion are configured such that thermal conduction is obtained in all directions, and wherein the first portion and the second portion are made of different materials;
a second layer and a third layer, the first layer being sandwiched between the second and the third layer;
a first notch at a surface of the second layer and a second notch at a surface of the third layer, wherein the first notch is located at a location corresponding to the first portion.

26. An electronic system, comprising:
an electronic device, comprising:
an integrated circuit die having a plurality of components formed thereon; and a heat dissipation structure thermally coupled to the integrated circuit die to dissipate heat generated by the at least one component, wherein the heat dissipation structure comprises a first layer having a first portion comprising a first material and a second portion comprising a second material having thermal characteristics different from the first material.

27. The electronic system of claim 20, wherein the first portion is located at a location corresponding to the component.

28. The electronic system of claim 26, wherein the heat dissipation structure further comprises a second layer and a third layer, wherein the first layer is sandwiched between the second and the third layers.

29. The electronic system of claim 26, further comprising at least one gap between the die and the heat dissipation structure at a location corresponding to the component.

30. A multi-chip device, comprising:
- a plurality of integrated circuit dies having at least a first and a second heat-generating components formed thereon; and
- a heat dissipation structure thermally coupled to the dies to dissipate heat generated by the components, wherein the heat dissipation structure comprises a composition having a first layer, the first layer having a first portion comprising a first material and a second portion comprising a second material different from the first material, the first portion and the second portion configured to match the heat generated by each of the first and second components.

31. An integrated circuit device, comprising:
- an integrated circuit die having a first surface and an opposite second surface;
- a plurality of components formed on the first surface, the components producing temperature gradient on the integrated circuit die;
- a heat dissipation structure thermally coupled to the die at an interface boundary at the second surface, the heat dissipation structure comprising:
  - a first portion having a first material;
  - a second portion having a second material, the second material having different thermal conductivity characteristics from the first material; and
- at least one gap at the interface boundary, the first portion, second portion and the at least one gap being configured to normalize the temperature gradient.

* * * * *